United States Patent
Nojima et al.

(10) Patent No.: US 8,336,004 B2
(45) Date of Patent: Dec. 18, 2012

(54) DIMENSION ASSURANCE OF MASK USING PLURALITY OF TYPES OF PATTERN AMBIENT ENVIRONMENT

(75) Inventors: Shigeki Nojima, Kanagawa (JP); Tetsuaki Matsunawa, Kanagawa (JP); Shigeru Hasebe, Oita (JP); Masahiro Miyairi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 45 days.

(21) Appl. No.: 13/024,604

(22) Filed: Feb. 10, 2011

(65) Prior Publication Data

US 2011/0201138 A1 Aug. 18, 2011

(30) Foreign Application Priority Data

Feb. 12, 2010 (JP) ................. 2010-029316

(51) Int. Cl.
*G06F 17/50* (2006.01)
(52) U.S. Cl. .......... 716/54; 716/50; 716/52; 430/5
(58) Field of Classification Search .......... 716/50, 716/52, 54; 430/5
See application file for complete search history.

(56) References Cited

U.S. PATENT DOCUMENTS

| | | | | |
|---|---|---|---|---|
| 6,691,052 | B1 * | 2/2004 | Maurer | 702/81 |
| 7,194,704 | B2 * | 3/2007 | Kotani et al. | 716/52 |
| 7,229,721 | B2 * | 6/2007 | Mimotogi et al. | 430/5 |
| 7,444,616 | B2 * | 10/2008 | Sandstrom et al. | 716/53 |
| 7,473,495 | B2 * | 1/2009 | Tanaka et al. | 430/5 |
| 7,730,445 | B2 * | 6/2010 | Nojima | 716/50 |
| 8,078,996 | B2 * | 12/2011 | Izuha et al. | 716/53 |
| 2006/0190875 | A1 | 8/2006 | Arisawa et al. | |
| 2007/0061773 | A1 * | 3/2007 | Ye et al. | 716/21 |
| 2010/0183960 | A1 * | 7/2010 | Oka et al. | 430/5 |

FOREIGN PATENT DOCUMENTS

| | | |
|---|---|---|
| JP | 9-319067 | 12/1997 |
| JP | 2003-107664 | 4/2003 |
| JP | 2005-292467 | 10/2005 |
| JP | 2006-292941 | 10/2006 |
| JP | 2009-186841 | 8/2009 |

OTHER PUBLICATIONS

Newmark, et al., "Large Area Proximity Correction using Pattern Based Corrections", SPIE vol. 2322, Photomask Technology and Management, pp. 374-386, (1994).

* cited by examiner

*Primary Examiner* — Naum Levin
(74) *Attorney, Agent, or Firm* — Finnegan, Henderson, Farabow, Garrett & Dunner, L.L.P.

(57) ABSTRACT

According to a mask verifying method of the embodiment, a difference between an actual dimension of a mask pattern and a simulation dimension is calculated as a computational estimated value. Moreover, a difference between an actual dimension of the mask pattern that is actually measured and a dimension on pattern data is calculated as an actually-measured difference. Then, it is verified whether a mask pattern dimension passes or fails based on the calculated value. When calculating the computational estimated value, a model function, which is set based on each correspondence relationship between an actual dimension and a mask simulation dimension of a test pattern, which includes a plurality of types of pattern ambient environments, to the mask pattern.

20 Claims, 7 Drawing Sheets

FIG.7A

| VARIATION (3σ) | DIFFERENCE BETWEEN MASK ACTUAL DIMENSION AND MASK WRITING DATA | DIFFERENCE BETWEEN MASK ACTUAL DIMENSION AND MASK-PATTERN EVALUATION VALUE CALCULATED BY USING MODEL FUNCTION |
|---|---|---|
| MONITOR PORTION W | 2.6 nm | 2.6 nm |
| MAIN CIRCUIT PORTION X | 3.5 nm → | 3.3 nm |

FIG.7B

| AVERAGE VALUE | DIFFERENCE BETWEEN MASK ACTUAL DIMENSION AND MASK WRITING DATA | DIFFERENCE BETWEEN MASK ACTUAL DIMENSION AND MASK-PATTERN EVALUATION VALUE CALCULATED BY USING MODEL FUNCTION |
|---|---|---|
| MONITOR PORTION W | 1.2 nm | -0.1 nm |
| MAIN CIRCUIT PORTION X | -1.4 nm → | 0.3 nm |

FIG.8

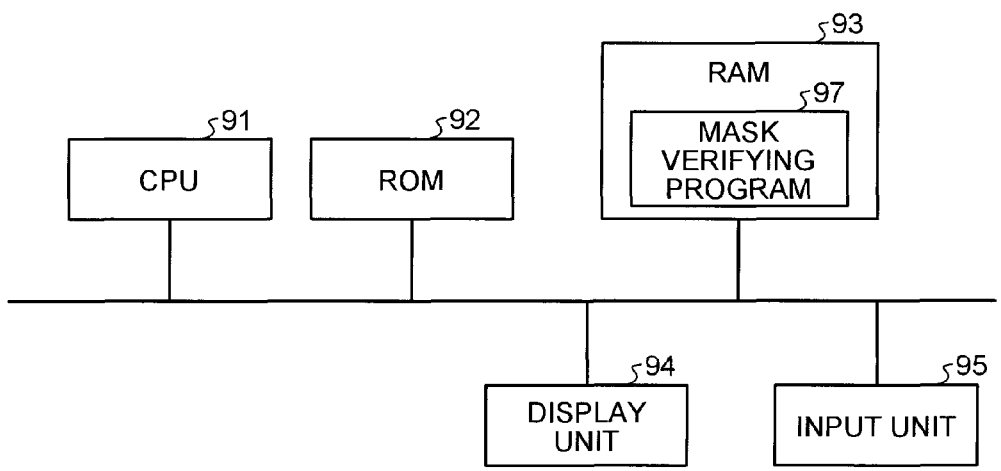

DIMENSION ASSURANCE OF MASK USING PLURALITY OF TYPES OF PATTERN AMBIENT ENVIRONMENT

CROSS-REFERENCE TO RELATED APPLICATIONS

This application is based upon and claims the benefit of priority from the prior Japanese Patent Application No. 2010-29316, filed on Feb. 12, 2010; the entire contents of which are incorporated herein by reference.

FIELD

The present embodiment typically relates to a mask verifying method, a manufacturing method of a semiconductor device, and a computer program product.

BACKGROUND

Recent progress of a semiconductor manufacturing technology is extremely remarkable, and semiconductor devices with a minimum feature size of 40 nm are mass-produced. Such miniaturization of a semiconductor device is realized by rapid progress of a micropatterning technology such as a mask process technology, a photolithography technology, and an etching technology. In the generation in which a pattern size is sufficiently large, a plane shape of an integrated circuit pattern that needs to be formed on a wafer is directly written as a design pattern and a mask pattern faithful to the design pattern is manufactured. Then, the manufactured mask pattern is transferred onto the wafer by projection optics, and a pattern approximately the same as the design pattern is formed on the wafer by etching a base with resist as a processing target film.

However, with the progress of miniaturization of an integrated circuit pattern, it has become difficult to faithfully form a pattern in each process. Consequently, a problem arises in that a final finished dimension does not become as a design pattern. Specially, in the lithography process or the etching process that is the most important process for achieving microfabrication, patterns arranged around a pattern that needs to be formed greatly affect the dimension accuracy of the pattern that needs to be formed.

In order to avoid such influence, technologies such as the OPC (Optical Proximity Correction) and the PPC (Process Proximity Correction) are developed. In these technologies, an auxiliary pattern is added in advance or a width of a pattern is thickened or thinned so that a shape of a processed integrated circuit pattern becomes a design pattern (desired value). With the use of the OPC or the PPC, a pattern (design pattern data) written by a designer can be formed on a wafer into approximately a desired shape. In the case of a conventional method using the OPC or the PPC, (1) process of correcting mask pattern data so that a resist dimension and a resist shape transferred onto a wafer have a desired value or (2) process of correcting mask pattern data so that a finished dimension and a finished shape of a final semiconductor circuit pattern transferred onto a wafer have a desired value is performed.

In the case of a mask for forming a minute integrated circuit pattern, a proximity effect occurs also in a process of manufacturing the mask itself. Therefore, there is a problem in that a data value of the mask and an actual finished shape of the mask differ. The OPC and the PPC are methods of correcting mask data based on a relationship between the mask data and a pattern shape on a wafer, so that the actual finished shape of the mask manufactured from the mask data before forming the pattern shape is uncertain.

Therefore, in order to ensure a finished shape of a mask itself, conventionally, one ambient environment (for example, a line & space pattern in which a dimension ratio of a line pattern and a space pattern is 1:1) is selected from a mask pattern and a finished dimension assurance of the mask in the selected ambient environment is performed.

However, with this method, the finished dimension assurance of the mask is performed only in one ambient environment, so that there is a problem in that the finished dimension assurance of the mask is not accurate. Thus, it is desired to accurately perform the finished dimension assurance of a mask pattern.

BRIEF DESCRIPTION OF THE DRAWINGS

FIG. 7A and FIG. 7B are diagrams illustrating one example of a dimension verification result of a mask pattern; and FIG. 8 is a diagram illustrating a hardware configuration of the mask pattern verifying apparatus.

DETAILED DESCRIPTION

According to an embodiment, a mask verifying method is provided. In the mask verifying method, a computational estimated value of a difference between an actual dimension of a verification target mask pattern to be a verification target extracted from a mask pattern formed on a mask and a simulation dimension of the verification target mask pattern calculated by a mask simulation when forming the verification target mask pattern is calculated as a first difference. Moreover, a difference between an actual dimension of the verification target mask pattern that is actually measured and a pattern dimension of the verification target mask pattern on pattern data is calculated as a second difference based on an actual measurement. Then, it is verified whether a pattern dimension of the mask pattern formed on the mask passes or fails based on whether a difference evaluation value obtained by using the first difference and the second difference is within a predetermined allowable range. When calculating the first difference, the first difference is calculated by applying a model function, which is set by using a test pattern formed on a mask for test, to the verification target mask pattern. The model function is a relational expression set based on each correspondence relationship between an actual dimension of the test pattern and a simulation dimension of the test pattern that is calculated by a mask simulation when forming the test pattern, under a plurality of types of pattern ambient environments.

A mask verifying method, a manufacturing method of a semiconductor device, and a computer program product according to the embodiment will be explained below in detail with reference to the accompanying drawings. The present invention is not limited to this embodiment.

(Embodiment)

Figure 1:
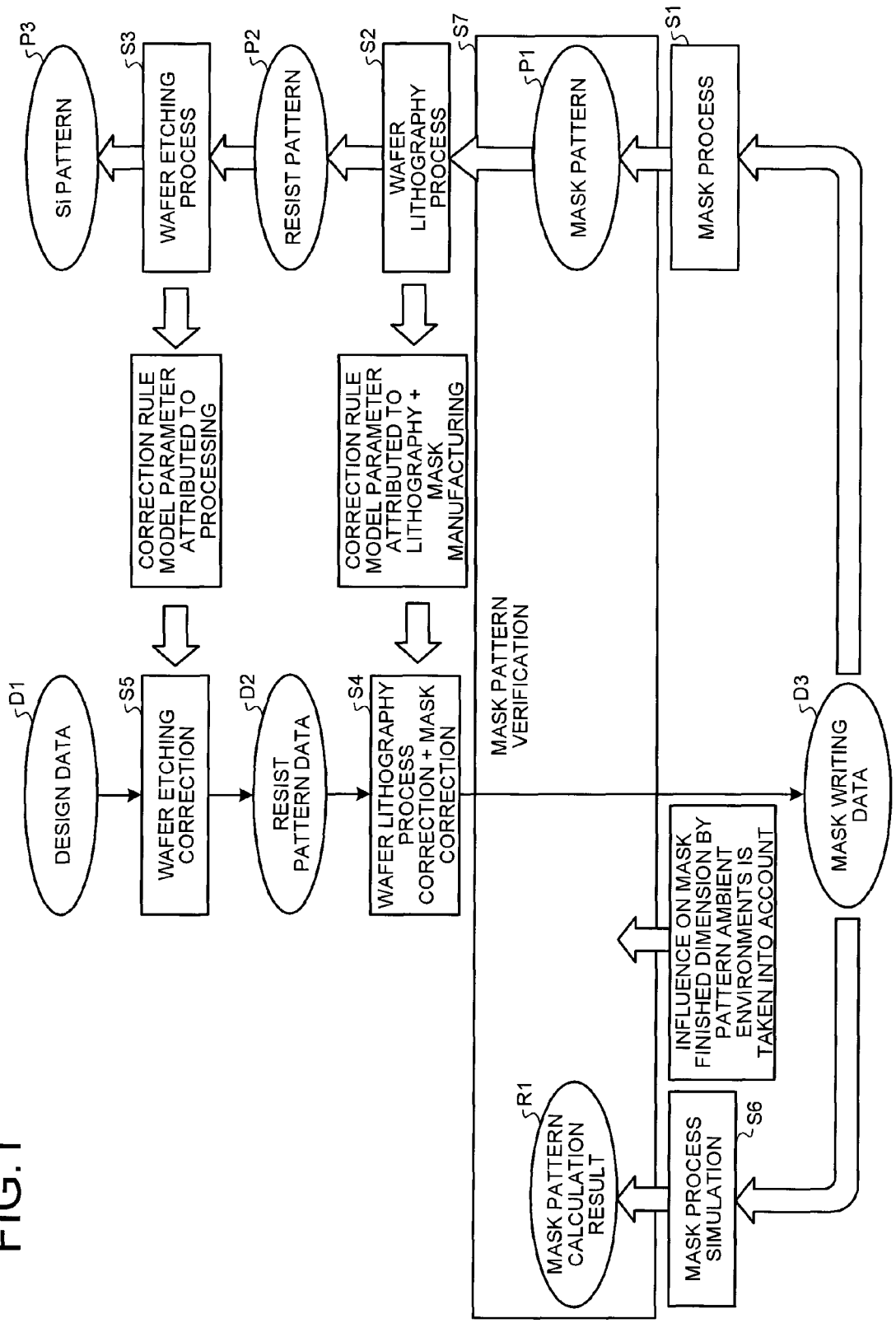
FIG. 1 is a diagram for explaining a whole process of a mask pattern verifying method according to a present embodiment.

FIG. 1 is a diagram for explaining a whole process of a mask pattern verifying method according to the present embodiment. The mask pattern verifying method in the present embodiment is a method of verifying a finished dimension of a mask pattern formed on a mask (photomask). In this mask pattern verifying method, a dimension verification of a mask pattern is performed based on a finished error of the mask pattern, an actually-measured dimension (hereinafter, mask actual dimension) of the mask pattern by an SEM or the like, and pattern data (target dimension) on the mask pattern. The finished error of the mask pattern is calculated by using a model function in which influence of ambient environments of the mask pattern on the finished dimension of a mask is taken into account.

The difference between the mask actual dimension and a dimension on mask writing data (mask pattern data) D3 includes a predetermined error amount depending on the ambient environment of a mask pattern. Therefore, in the present embodiment, the difference (variation) between the mask actual dimension and the dimension on the mask writing data D3 is calculated in advance by the model function in which pattern ambient environments (hereinafter, mask ambient environments) of a mask pattern are taken into account. Thus, the model function in the present embodiment is a relational expression for calculating the difference ($\Delta$ to be described later) between the mask actual dimension and the dimension on the mask writing data D3 in the case of varying a space pattern width, a line pattern width, or the like of a line & space pattern as the mask ambient environment. Information (such as a space pattern width and a line pattern width) on the mask ambient environment is input to the model function and $\Delta$ is derived as a result thereof.

When verifying the finished dimension of a mask pattern, it is determined whether a value (variation from an ideal value) obtained by summing the difference between the actually-measured mask actual dimension and the dimension on the mask writing data D3 and $\Delta$ as a variation of this difference is within an allowable range. Specifically, the dimension on the mask writing data D3 is added to $\Delta$ and the value obtained by subtracting the actually-measured mask actual dimension from the value obtained by the addition is calculated. If the calculated value is within the allowable range, the mask pattern is determined to pass, and if the calculated value is out of the allowable range, the mask pattern is determined to fail.

First, design data D1 on an on-wafer pattern (post-etching pattern) to be formed on a substrate such as a wafer is generated. Then, resist pattern data (lithography target) D2 to be formed on a wafer is generated based on the design data D1. Moreover, the mask writing data D3 is generated based on the resist pattern data D2. The mask writing data D3 is data on a mask pattern to be formed on a mask.

Thereafter, a mask is manufactured by a mask process S1 in which the mask writing data D3 is used. Specifically, a mask pattern P1 corresponding to the mask writing data D3 is formed on the mask.

A lithography process (wafer lithography process S2 such as exposure and development) on a wafer is performed by using the manufactured mask, whereby a resist pattern P2 is formed on the wafer. Specifically, resist is applied to the wafer and the resist is irradiated with exposure light via the mask. Consequently, the mask pattern P1 is transferred onto the mask, and as a result, the resist pattern P2 is formed.

After the resist pattern P2 is formed, an etching process (wafer etching process S3) on the wafer is performed, whereby an Si (silicon) pattern P3 or the like is formed as the on-wafer pattern on the wafer. Specifically, the lower layer film of the wafer is subjected to the wafer etching with the resist pattern P2 as a mask, whereby the Si pattern P3 is formed on the wafer.

When manufacturing the mask by the mask process S1, a pattern dimension deviation attributed to the mask manufacturing occurs. This is a dimension deviation between the mask writing data D3 and the mask pattern P1 caused due to the writing process and the like when manufacturing the mask. Moreover, when performing pattern formation on a wafer by the wafer lithography process S2, the pattern dimension deviation attributed to the lithography occurs. This is a dimension deviation caused due to the exposure process, the development process, and the like in the lithography and a dimension deviation between the resist pattern data D2 and the resist pattern P2.

Therefore, a correction rule model M1 (not shown) that corrects the pattern dimension deviation attributed to the lithography and the pattern dimension deviation attributed to the mask manufacturing is generated in advance. If the pattern dimension deviation attributed to the lithography and the pattern dimension deviation attributed to the mask manufacturing are not within a predetermined allowable range, the mask writing data D3 is corrected by using the correction rule model M1. Specifically, a correction rule model parameter C1 corresponding to the pattern dimension deviation amount attributed to the lithography and the pattern dimension deviation amount attributed to the mask manufacturing is set to the correction rule model M1. Then, the correction rule model M1 to which the correction rule model parameter C1 is set is applied to the resist pattern data D2 to perform a correction S4 (a wafer lithography process correction and a mask correction), whereby the mask writing data D3 is generated (corrected).

Moreover, when forming the Si pattern P3 by the wafer etching process S3, the pattern dimension deviation attributed to the processing such as the wafer etching occurs. This is a dimension deviation between the design data D1 and the Si pattern P3 caused due to the etching process and the like when forming the Si pattern P3.

Therefore, a correction rule model M2 (not shown) that corrects the pattern dimension deviation attributed to the processing is generated in advance. If the pattern dimension deviation attributed to the processing is not within a predetermined allowable range, the resist pattern data D2 is corrected by using the correction rule model M2. Specifically, a correction rule model parameter C2 corresponding to the pattern dimension deviation amount attributed to the processing is set to the correction rule model M2. Then, the correction rule model M2 to which the correction rule model parameter C2 is set is applied to the design data D1 to perform a wafer etching correction S5, whereby the resist pattern data D2 is generated (corrected). When the resist pattern data D2 is corrected, the mask writing data D3 is corrected by using the corrected resist pattern data D2.

After the mask writing data D3 is corrected, a mask process simulation S6 is performed by applying the model function to the mask writing data D3. Moreover, the mask actual dimension of the actual mask pattern P1 in the case of manufacturing a mask by using the mask writing data D3 is measured in advance. Then, the dimension difference (difference based on the actual measurement) between the mask actual dimension of the mask pattern P1 and the mask writing data D3 is calculated. Thereafter, a mask pattern calculation result R1 calculated by the mask process simulation S6 is added to the difference based on the actual measurement and a finished dimension verification (pass/failure determination of a mask) (mask pattern verification S7) of the mask pattern is performed based on the result of addition.

The mask ambient environment is, for example, a space pattern width, a line pattern width, a pitch, and a pattern coverage (area occupancy of a line pattern in a predetermined region) of a line & space pattern. The model function is set in advance by using the difference (difference between a simulation dimension and the mask actual dimension) in various mask ambient environments. The mask actual dimension in various mask ambient environments is, for example, a pattern dimension obtained by actually measuring a test mask by an SEM (Scanning Electron Microscope) or the like. Moreover, the simulation dimension in various mask ambient environments is a value of a pattern dimension calculated by applying a predetermined mask process simulation to the test mask. The mask actual dimension and the simulation dimension in the same mask ambient environment are associated with each other and the model function is set based on the difference between the associated mask actual dimension and simulation dimension.

When verifying a dimension of a mask pattern, Δ is calculated by using the model function and a mask-pattern evaluation value is calculated by adding a dimension of a mask assurance pattern to Δ. The mask-pattern evaluation value is a value to be compared with the actually-measured mask actual dimension and is a computational mask finished dimension in which the dimension error amount in the case of taking various ambient environments into account is added.

After the mask-pattern evaluation value is calculated, it is determined whether the difference between the mask-pattern evaluation value calculated by using the model function and the actually-measured mask actual dimension is within a predetermined allowable range. For example, verification of a mask pattern is performed based on whether the variation (for example, 3σ) and the average value of the differences between the mask-pattern evaluation value and the mask actual dimension are within a predetermined range. If the calculated difference is within the predetermined allowable range, the dimension of the mask pattern is determined to pass. Then, the wafer process (the wafer lithography process S2 and the wafer etching process S3) is performed by using the mask on which the mask pattern is formed. Consequently, a semiconductor device is formed on a wafer.

On the other hand, if the calculated difference is not with the predetermined allowable range, the dimension of the mask pattern is determined to fail. In this case, the mask writing data D3 is corrected so that the difference between the mask-pattern evaluation value and the mask actual dimension falls within the predetermined allowable range. Then, the wafer process is performed by using the mask in which the difference between the mask-pattern evaluation value and the mask actual dimension falls within the predetermined allowable range, whereby a semiconductor device is formed on a wafer.

When the mask pattern is not determined to pass even if the mask writing data D3 is corrected, the design data D1 or the resist pattern data D2 can be corrected or the mask process S1, the wafer lithography process S2, the wafer etching process S3, or the like can be changed. In the case of correcting the design data D1, the resist pattern data D2 is corrected in accordance with correction of the design data D1, and further the mask writing data D3 is corrected in accordance with correction of the resist pattern data D2. In the case of correcting the resist pattern data D2, the mask writing data D3 is corrected in accordance with correction of the resist pattern data D2.

In this manner, it is determined whether the difference between the mask-pattern evaluation value and the mask actual dimension is within the predetermined allowable range, and a dimension assurance of a mask pattern formed on a mask is performed by using the mask determined to pass in the wafer process.

Conventionally, in order to ensure the finished dimension of a mask pattern, a measurement result of a limited pattern (such as an isolated pattern or one type of line & space pattern) is used. On the other hand, in the present embodiment, the mask-pattern evaluation value corresponding to the finished dimension of a mask pattern is estimated from the mask writing data D3 by using the model function in which the mask ambient environments are taken into account. Consequently, the dimension assurance can be performed on various mask pattern shapes without being limited by a mask pattern shape.

Figure 2:
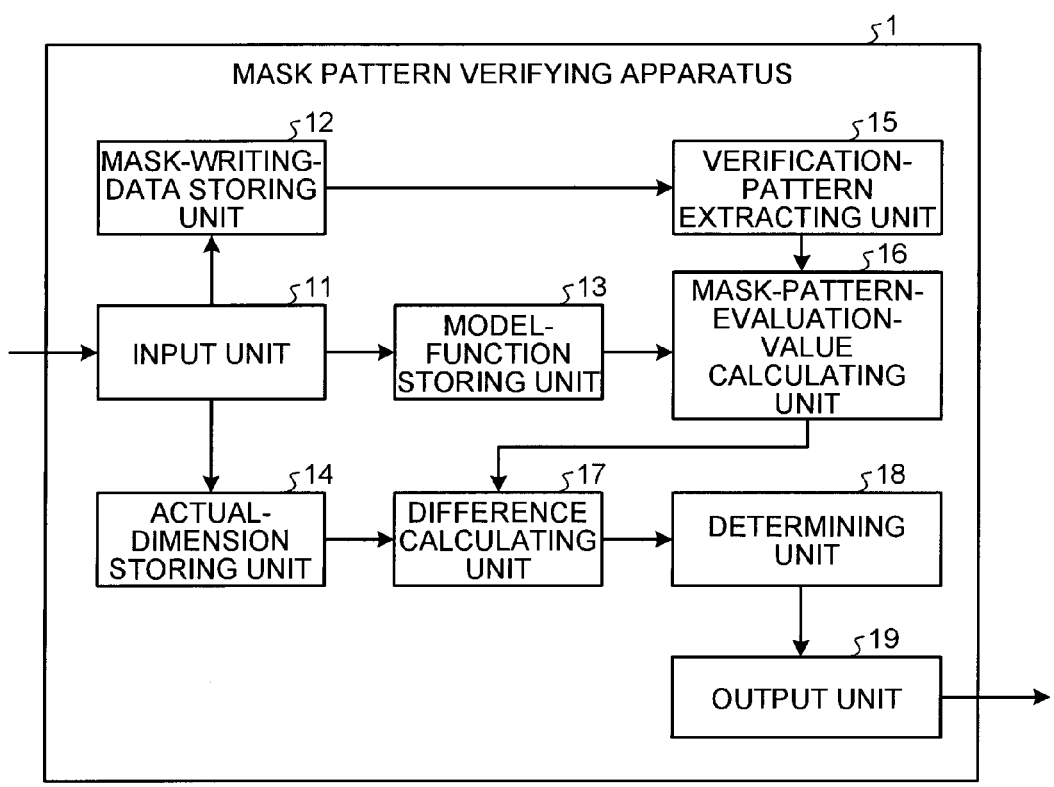
FIG. 2 is a block diagram illustrating a configuration of a mask pattern verifying apparatus.

Next, the configuration of a mask pattern verifying apparatus that performs the dimension verification of a mask pattern is explained. FIG. 2 is a block diagram illustrating the configuration of the mask pattern verifying apparatus. A mask pattern verifying apparatus 1 includes an input unit 11, a mask-writing-data storing unit 12, a model-function storing unit 13, an actual-dimension storing unit 14, a verification-pattern extracting unit 15, a mask-pattern-evaluation-value calculating unit 16, a difference calculating unit 17, a determining unit 18, and an output unit 19.

The input unit 11 inputs the mask writing data D3, the model function, the actually-measured mask actual dimension, and the like in the mask pattern verifying apparatus 1. The model function is a relational expression for calculating a computational estimated value of the difference between the mask actual dimension and the simulation dimension (simulation value) of a mask pattern by the mask process simulation. The mask actual dimension input to the input unit 11 is, for example, a dimension of the mask assurance pattern actually measured by an SEM or the like. The input unit 11 sends the mask writing data D3 to the mask-writing-data storing unit 12, sends the model function to the model-function storing unit 13, and sends the mask actual dimension to the actual-dimension storing unit 14.

The mask-writing-data storing unit 12 is, for example, a memory that stores therein the mask writing data D3. The model-function storing unit 13 is, for example, a memory that stores therein the model function, and the actual-dimension storing unit 14 is, for example, a memory that stores therein the mask actual dimension.

The verification-pattern extracting unit 15 extracts the mask assurance pattern as a monitor pattern used for the mask assurance (verification of a mask pattern) from the mask writing data D3 in the mask-writing-data storing unit 12. The mask assurance pattern is a mask pattern for finished dimension assurance of a mask pattern and a verification target pattern (verification target mask pattern) of the finished dimension. The verification-pattern extracting unit 15 sends the extracted mask assurance pattern to the mask-pattern-evaluation-value calculating unit 16.

The mask-pattern-evaluation-value calculating unit 16 applies the model function in the model-function storing unit 13 to the mask assurance pattern and calculates the mask-pattern evaluation value (computational estimated value of the finished dimension on a mask) (simulation dimension) of the mask assurance pattern.

Specifically, the mask-pattern-evaluation-value calculating unit 16 calculates a computational difference (first difference that is an error estimated value of the difference between the mask actual dimension and the simulation dimension of a mask pattern) by using the model function by inputting the dimension (a dimension of a line pattern or a dimension of a space pattern) of the mask assurance pattern or the like to the model function. The dimension of the mask assurance pattern input to the mask-pattern-evaluation-value calculating unit 16 can be the ambient environment different from the ambient environments used for setting the model function. In the setting of the model function, various ambient environments are used; however, the dimension of the mask assurance pattern input to the mask-pattern-evaluation-value calculating unit 16 can be at least one ambient environment (arbitrary pattern dimension). The mask-pattern-evaluation-value calculating unit 16 calculates the mask-pattern evaluation value by adding the dimension of the mask assurance pattern on pattern data to the computational difference obtained by using the model function. The mask-pattern-evaluation-value calculating unit 16 sends the calculated mask-pattern evaluation value to the difference calculating unit 17.

The difference calculating unit 17 calculates the difference (second difference) between the mask actual dimension in the actual-dimension storing unit 14 and the mask-pattern evaluation value calculated by the mask-pattern-evaluation-value calculating unit 16. The difference calculated by the difference calculating unit 17 is the difference (deviation amount) between the mask-pattern evaluation value and a mask pattern actually formed on a mask. The difference calculating unit 17 sends the calculated difference to the determining unit 18.

The determining unit 18 determines whether the difference between the mask actual dimension and the mask-pattern evaluation value calculated by the difference calculating unit 17 is within an allowable range. When the difference is within the allowable range, the determining unit 18 determines the mask pattern on the mask to pass, and when the difference is not within the allowable range, the determining unit 18 determines the mask pattern on the mask to fail. The output unit 19 outputs the determination result by the determining unit 18 to an external apparatus or the like.

Figure 3:
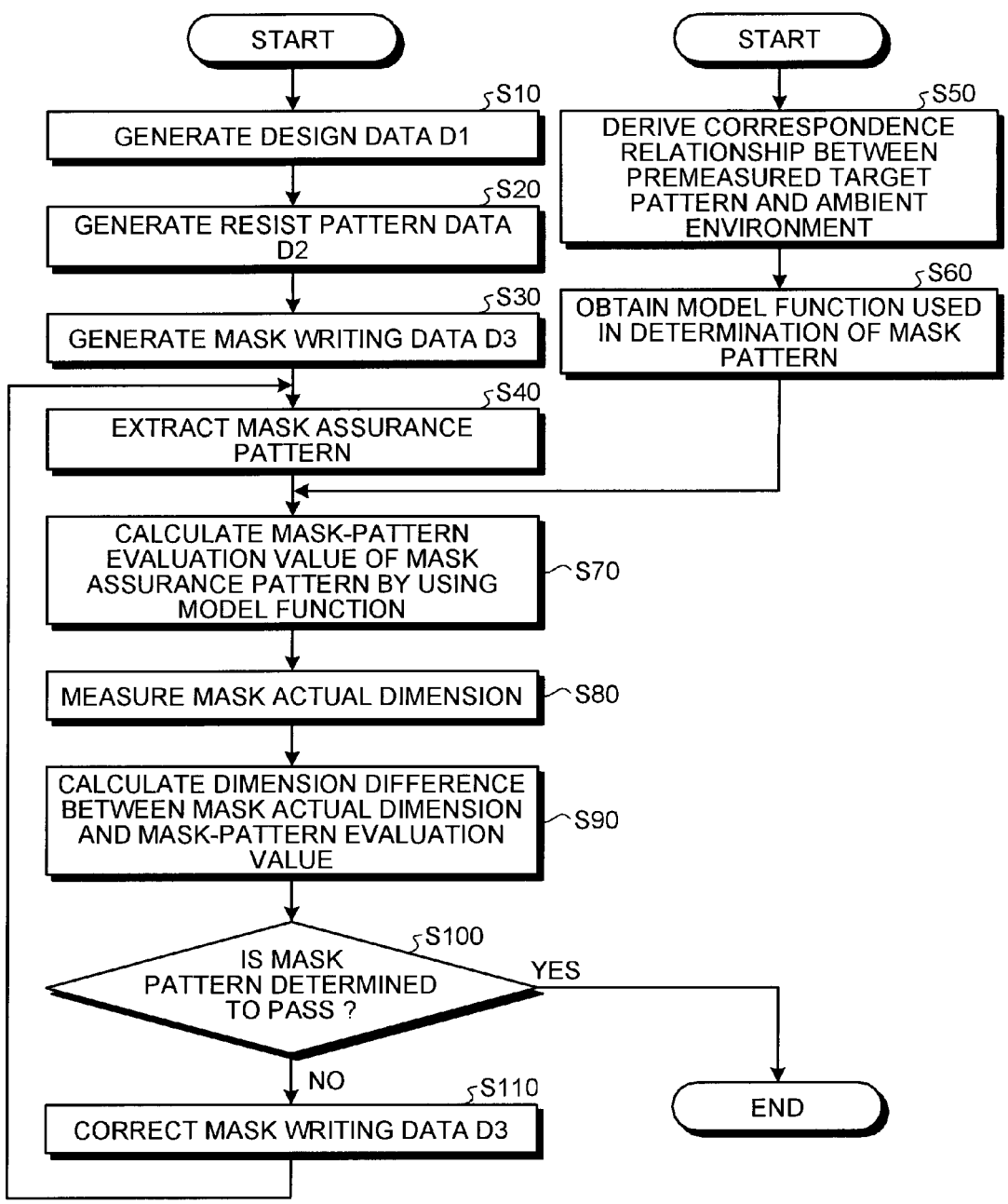
FIG. 3 is a diagram for explaining a dimension verifying process procedure of a mask pattern.

Next, the dimension verifying process procedure of a mask pattern is explained. FIG. 3 is a diagram for explaining the dimension verifying process procedure of a mask pattern. The design data D1 corresponding to a desired on-wafer pattern is generated by an apparatus for generating the design data or the like (Step S10). The apparatus for generating the design data is an apparatus such as a computer that generates the design data.

Thereafter, the resist pattern data D2 to be formed on a wafer is generated by an apparatus for generating the resist pattern data or the like based on the design data D1 (Step S20). The apparatus for generating the resist pattern data is an apparatus such as a computer that generates the resist pattern data D2 in accordance with the design data D1.

Furthermore, the mask writing data (mask pattern data) D3 is generated by an apparatus for generating the mask writing data or the like based on the resist pattern data D2 (Step S30). The apparatus for generating the mask writing data is an apparatus such as a computer that generates the mask writing data D3 in accordance with the resist pattern data D2.

The input unit 11 inputs the mask writing data D3 and sends it to the mask-writing-data storing unit 12. The mask-writing-data storing unit 12 stores therein the mask writing data D3. The verification-pattern extracting unit 15 extracts the mask assurance pattern from the mask writing data D3 in the mask-writing-data storing unit 12 (Step S40). The verification-pattern extracting unit 15 sends the extracted mask assurance pattern to the mask-pattern-evaluation-value calculating unit 16.

Moreover, aside from the mask assurance pattern, the model function is derived by using the test mask. The test mask is a mask for setting the model function in which various mask patterns (model-function setting mask patterns) including various space pattern widths, various line pattern widths, various pitches, various pattern coverages, and the like are formed. In other words, the test mask is a mask including mask patterns formed in various mask ambient environments.

A creator of the model function extracts a plurality of target patterns in advance from the mask patterns of the test mask. Then, the dimension of each target pattern is measured by an SEM or the like. The correspondence relationship (ambient environment dependency of a target pattern) between the dimension of the target pattern and the ambient environment is derived (Step S50).

Figure 4:
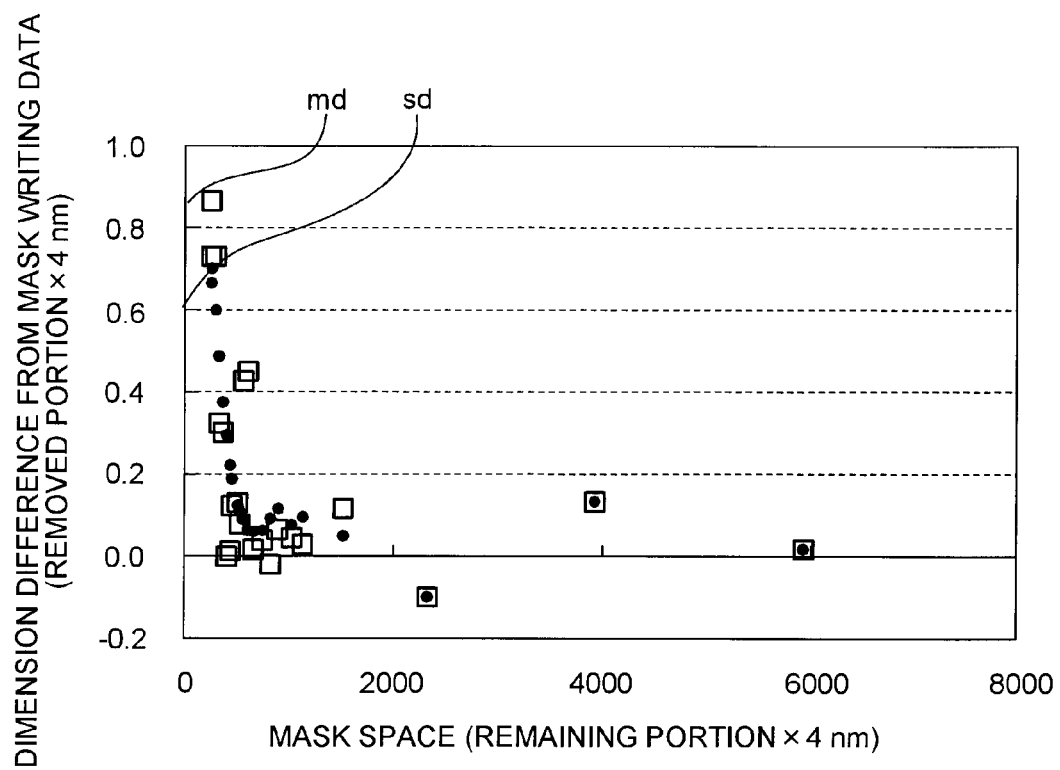
FIG. 4 is a diagram for explaining a correspondence relationship between a dimension of a target pattern and an ambient environment.

FIG. 4 is a diagram for explaining the correspondence relationship between the target pattern and the ambient environment. A dimension difference md between the dimension (mask actual dimension) in the case where the target pattern is actually measured and the dimension on the mask writing data D3 is calculated in advance with respect to various target patterns of the test mask. Moreover, a dimension difference sd between the simulation dimension obtained when the mask simulation is performed on the target pattern and the dimension on the mask writing data D3 is calculated in advance with respect to the target pattern for which the dimension difference md is calculated. The target pattern in this example is manufactured by variously changing a space pattern width while keeping a mask pattern width at a constant value.

In FIG. 4, a horizontal axis indicates a space pattern width (mask space) of a mask pattern and a vertical axis indicates a dimension difference from the mask writing data D3. The space pattern width indicated on the horizontal axis is a dimension of a pattern remaining portion (light shielding portion) of a mask pattern. The dimension difference from the mask writing data D3 indicated on the vertical axis is the dimension difference md between a space pattern width on mask data and the mask actual dimension and the dimension difference sd between a space pattern width on mask data and the simulation dimension. The dimension indicated in FIG. 4 is a dimension on the test mask, and when a pattern is formed on a wafer by using the test mask, the dimension of the pattern becomes four times of the dimension on the test mask.

As shown in FIG. 4, when the dimension of the mask space is below 1000 nm, the difference from the mask writing data D3 becomes as large as up to about 0.8 nm. On the other hand, when the dimension of the mask space is as large as 6000 nm, it is found that the difference from the mask writing data D3 is small. Therefore, the proper target dimension of the mask pattern can be obtained by adding an error of up to about 0.8 nm in accordance with the dimension of the ambient environment (remaining portion) of the mask assurance pattern.

In the present embodiment, the difference between the simulation dimension of a mask pattern and the mask actual dimension in the case of varying the mask ambient environment is measured and the simulation model (function) for expressing this difference is obtained in advance. In other words, the model function (model function used for calculating the mask-pattern evaluation value) used for determining a mask pattern is obtained based on the correspondence relationship between the dimension difference md and the dimension difference sd for each ambient environment (for each space pattern width) as shown in FIG. 4. In this manner, the model function is a relational expression generated based on each correspondence relationship between the actual dimension of a mask pattern formed on the test mask and the simulation dimension of the test mask under a plurality of types of mask ambient environments (Step S60). The input unit 11 inputs the model function and sends it to the model-function storing unit 13. The model-function storing unit 13 stores therein the model function.

In FIG. 4, the case is explained in which a space pattern width is variously changed as the ambient environment; however, it is not limited to the case of variously changing a space pattern width and it is applicable to use the ambient environment in which a line pattern width, a pitch, a pattern coverage, or the like is variously changed. Moreover, it is applicable to use the ambient environment in which a space pattern width, a line pattern width, a pitch, a pattern coverage, and the like are combined and variously changed.

As the model function, for example, a function expressed by the following equation (1) is used. In equation (1), $\Delta$ is an estimated value (calculated value) of the difference (maximum variation) between the mask actual dimension and the simulation dimension of a mask in the mask assurance pattern. The mask actual dimension in the above is an actually-measured estimated value in the case of actually measuring the mask assurance pattern and the simulation dimension is a simulation value in the case of applying the mask simulation to the mask assurance pattern. Therefore, the estimated value of the difference between the pattern dimension (ideal value) on the mask writing data D3 and the mask actual dimension is calculated by the model function. Moreover, Line is a line pattern width and Space is a space pattern width.

$$\Delta = c_0 + a_1 xA \tan(\text{Line}/300) + a_2 xA \tan(\text{Line}/500) + a_3 xA \tan(\text{Line}/750) + a_4 xA \tan(\text{Line}/1200) + b_1 x \exp(-\text{Space}^2/500^2) + b_2 x \exp(-\text{Space}^2/600^2) + b_3 x \exp(-\text{Space}^2/1500^2) + b_4 x \exp(-\text{Space}^2/2500^2) \quad (1)$$

The coefficients such as $c_0$, $a_1$, $a_2$, $a_3$, $a_4$, A, $b_1$, $b_2$, $b_3$, and $b_4$ in equation (1) are derived by using the correspondence relationship (difference) for each ambient environment between the dimension difference md and the dimension difference sd derived by using the test mask. Specifically, the coefficients such as $c_0$, $a_1$, $a_2$, $a_3$, $a_4$, A, $b_1$, $b_2$, $b_3$, and $b_4$ in equation (1) are set so that the difference between the dimension difference md and the dimension difference sd becomes small. The dimension verification of a mask pattern is performed by using the model function in which the coefficients are set in this manner.

Specifically, the mask-pattern evaluation value of the mask assurance pattern is calculated by applying the model function to the mask assurance pattern (Step S70). At this time, the mask-pattern-evaluation-value calculating unit 16 calculates an estimated value of the computational difference (difference between the simulation dimension of a mask pattern and the mask actual dimension) obtained by using the model function by using the model function in the model-function storing unit 13.

Moreover, the mask-pattern-evaluation-value calculating unit 16 calculates the mask-pattern evaluation value by adding the dimension (dimension on pattern data) of the mask assurance pattern to the computational difference obtained by using the model function. The mask-pattern-evaluation-value calculating unit 16 sends the calculated mask-pattern evaluation value to the difference calculating unit 17.

The mask actual dimension that is the actual dimension of the mask assurance pattern is measured in advance by an SEM or the like (Step S80). The input unit 11 inputs the mask actual dimension and sends it to the actual-dimension storing unit 14. The actual-dimension storing unit 14 stores therein the mask actual dimension in advance.

The difference calculating unit 17 calculates the difference between the mask actual dimension in the actual-dimension storing unit 14 and the mask-pattern evaluation value calculated by the mask-pattern-evaluation-value calculating unit 16 (Step S90). The difference calculating unit 17 sends the calculated difference to the determining unit 18. The mask pattern verifying apparatus 1 repeats the processes from Steps S40 to S90 for the number of the mask assurance patterns (measurement points).

An example of the dimension calculated at Steps S70 to S90 is explained. For example, it is assumed that the simulation dimension of the mask assurance pattern is A' and the mask actual dimension of the mask assurance pattern is B'. Moreover, the dimension of the mask assurance pattern on the pattern data is C. Furthermore, the mask actual dimension of the mask assurance pattern measured by an SEM or the like is B.

In this case, the mask-pattern-evaluation-value calculating unit 16 calculates $\Delta = (A'-B')$ as the difference between the simulation dimension of the mask assurance pattern and the mask actual dimension of the mask assurance pattern by using the model function. The model function is an equation for calculating $\Delta$, so that specific values of A' and B' are not calculated.

Moreover, the mask-pattern-evaluation-value calculating unit 16 calculates the computational mask-pattern evaluation value $((A'-B')+C)$ by adding C that is the dimension of the mask assurance pattern on the pattern data to $\Delta$ calculated by using the model function. Furthermore, the difference calculating unit 17 calculates the difference between the calculated computational mask-pattern evaluation value $((A'-B')+C)$ and the actually-measured mask actual dimension (B). Specifically, $(A'-B'+C-B)$ is calculated as the difference between the mask actual dimension and the mask-pattern evaluation value. Actually, $\Delta$ is calculated without $(A'-B')$ being calculated, so that $(\Delta+C-B)$ is calculated as the difference between the mask actual dimension and the mask-pattern evaluation value.

In this example, (C−B) is the difference between the dimension C of the mask assurance pattern on the pattern data and the mask actual dimension B. Therefore, the difference between the mask actual dimension and the mask-pattern evaluation value calculated at Step S90 is a value obtained by summing the difference (C−B) between the dimension C of the mask assurance pattern on the pattern data and the mask actual dimension B and the variation ($\Delta$) in the case where the ambient environments are taken into account.

Therefore, it is applicable that the mask-pattern-evaluation-value calculating unit 16 calculates $\Delta$ and the mask-pattern-evaluation-value calculating unit 16 or the difference calculating unit 17 calculates the difference (C−B). In this case, the difference (C−B) and $\Delta$ are summed up by the difference calculating unit 17 and the value obtained by the summation becomes the difference between the mask actual dimension and the mask pattern evaluated value.

The determining unit 18 determines whether the value (difference between the mask actual dimension and the mask-pattern evaluation value) calculated by the difference calculating unit 17 is within an allowable range. Specifically, the determining unit 18 calculates the variation (for example, $3\sigma$) or the average value of the differences in respective mask assurance patterns calculated by the difference calculating unit 17 and determines whether the difference or the variation are within the allowable range. In this manner, the determining unit 18 determines whether the mask pattern passes or fails (Step S100). When the difference is within the allowable range, the determining unit 18 determines the mask pattern of the mask assurance pattern to pass, and when the difference is not within the allowable range, the determining unit 18 determines the mask pattern of the mask assurance pattern to fail. The output unit 19 outputs the determination result by the determining unit 18 to an external apparatus or the like.

When the mask pattern is determined to fail (No at Step S100), the mask writing data D3 is corrected so that the mask pattern is determined to pass (Step S110). Then, the processes at Steps S40 to S100 are performed.

When the mask pattern is determined to pass (Yes at Step S100), the wafer lithography process S2, the wafer etching process S3, and the like are performed by using the mask on which the mask assurance pattern is formed.

It is sufficient that the process at Step S50, the process at Step S60, and the input process of the model function to the input unit 11 are performed before the process at Step S70. Moreover, it is sufficient that the process at Step S80 and the input process of the mask actual dimension to the input unit 11 are performed before the process at Step S90.

Next, the arrangement position of the mask assurance pattern is explained. The mask assurance pattern is, for example, arranged in a monitor portion in which a main circuit is not formed or the like in a mask pattern. The monitor portion is an area between the main circuit portions or around the main circuit portion out of the main circuit portion and is, for example, a scribe line.

Figure 5:
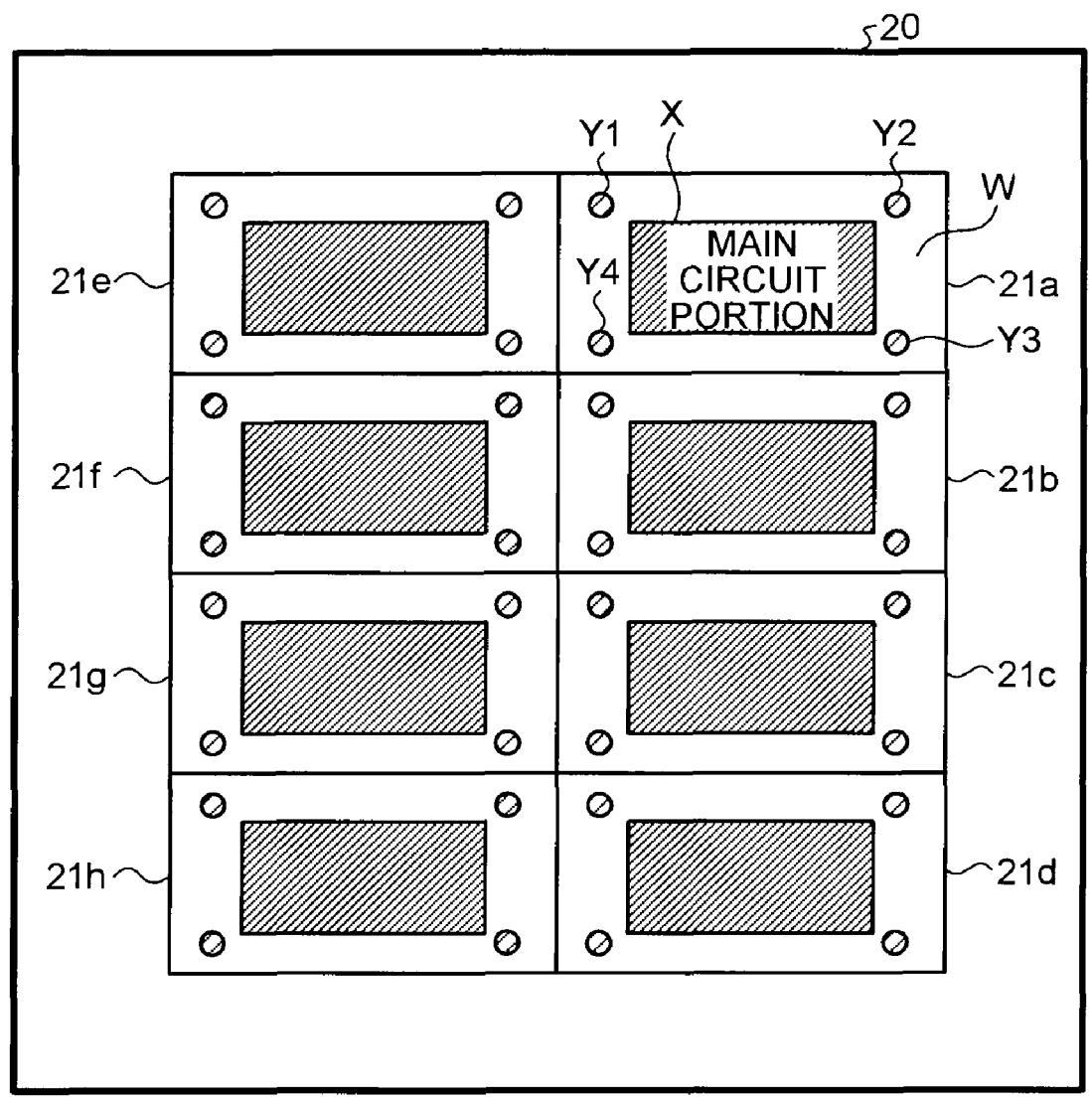
FIG. 5 is a diagram illustrating a mask pattern in the case where mask assurance patterns are arranged in a monitor portion.

FIG. 5 is a diagram illustrating a mask pattern in the case where the mask assurance patterns are arranged in the monitor portion. FIG. 5 illustrates a diagram in the case where a mask pattern 20A is viewed from the upper surface side. The mask pattern 20A is a mask pattern for one shot, in which one to a plurality of product chip patterns is arranged. FIG. 5 illustrates the case where eight product chip patterns 21a to 21h are arranged in the mask pattern 20A.

In each of the product chip patterns 21a to 21h, an approximately rectangular main circuit portion Xa is arranged and the peripheral portion of the main circuit portion Xa is a monitor portion W that is a ring-shape region. Moreover, in each of the product chip patterns 21a to 21h, the mask assurance pattern is arranged at arrangement positions Y1 to Y4 in the monitor portion W. FIG. 5 illustrates the case where positions near respective apexes of the main circuit portion Xa in the monitor portion W (outside of the main circuit portion Xa) are the arrangement positions Y1 to Y4 of the mask assurance pattern.

Figure 6:
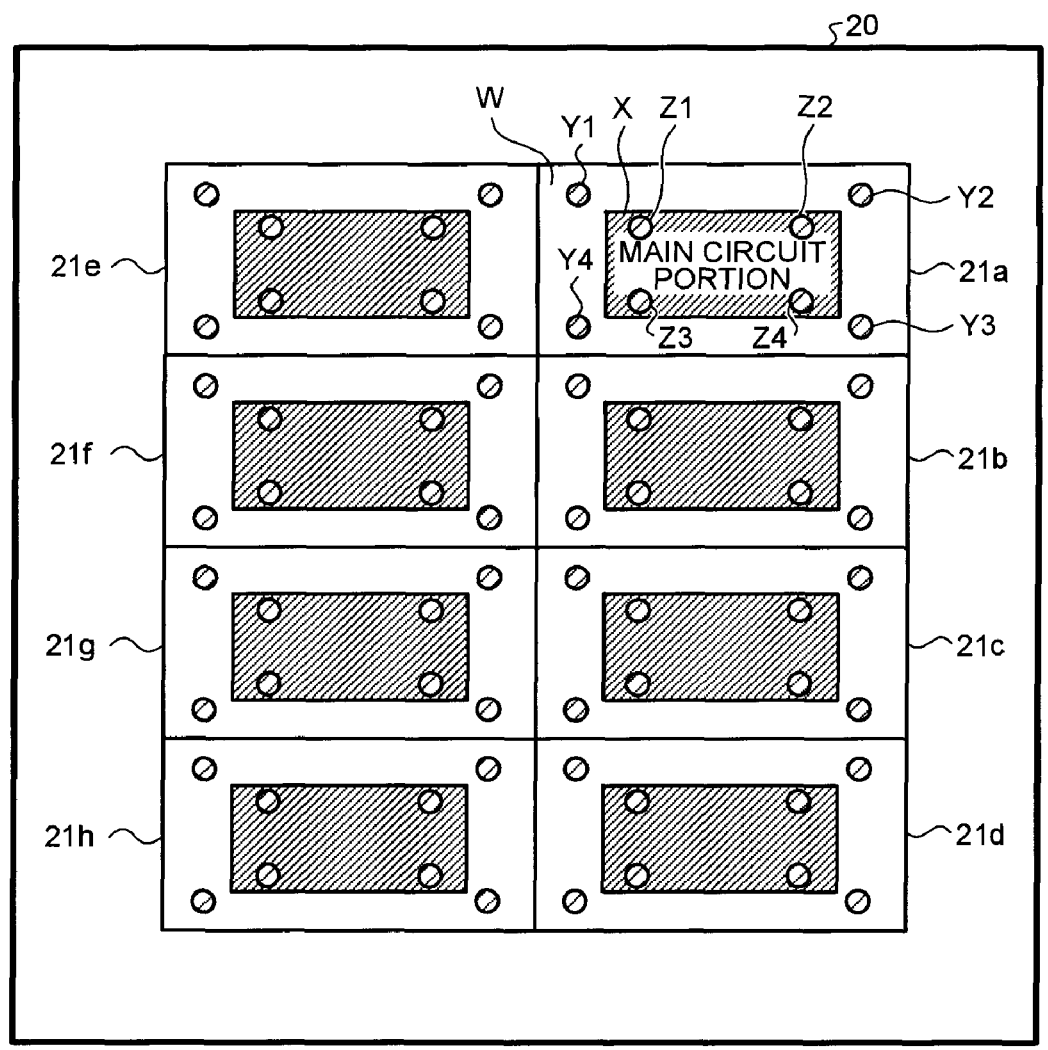
FIG. 6 is a diagram illustrating a mask pattern in the case where the mask assurance patterns are arranged in both of the monitor portion and a main circuit portion.

The mask assurance pattern can be arranged only in the main circuit portion Xa. Furthermore, the mask assurance pattern can be arranged in both of the monitor portion W and the main circuit portion Xa. FIG. 6 is a diagram illustrating a mask pattern in the case where the mask assurance pattern is arranged in both of the monitor portion and the main circuit portion. FIG. 6 illustrates a diagram in the case where the mask pattern is viewed from the upper surface side. In each of the product chip patterns 21a to 21h in a mask pattern 20B, the mask assurance pattern is arranged at the arrangement positions Y1 to Y4 in the monitor portion W and the mask arrangement pattern is arranged at arrangement positions Z1 to Z4 in a main circuit portion Xb.

In each of the product chip patterns 21a to 21h, the mask assurance pattern is arranged at the arrangement positions Y1 to Y4 in the monitor portion W and the arrangement positions Z1 to Z4. FIG. 6 illustrates the case where the arrangement positions Y1 to Y4 of the mask assurance pattern are outside the main circuit portion Xb (monitor portion W) and the arrangement positions Z1 to Z4 of the mask assurance pattern are inside the main circuit portion Xb. The mask assurance pattern arranged at the arrangement positions Z1 to Z4 in the main circuit portion Xb can be an actual product pattern or a dummy pattern for mask assurance.

The mask assurance pattern is arranged in the monitor portion W and the main circuit portion Xb, so that the mask pattern dimension can be recognized in the monitor portion W and the main circuit portion Xb. Consequently, the mask finished dimension can be accurately verified by using the mask assurance pattern.

Moreover, conventionally, as the mask assurance pattern, the same pattern of a minimum design of a circuit configuring a mask is used. On the other hand, in the present embodiment, a plurality of types of the mask assurance patterns is arranged at a plurality of locations. Moreover, the dimension verification of a mask pattern is performed by using the model function in which the influence on the mask-pattern evaluation value (mask finished dimension) by the mask ambient environments is taken into account. Therefore, it becomes possible to perform the dimension verification of a mask pattern with respect to various ambient environments.

Next, the difference between the dimension verification result of a mask pattern by a conventional method and the dimension verification result of a mask pattern by the mask pattern verifying apparatus 1 is explained. The dimension verification of a mask pattern by the conventional method is a dimension verification of a mask pattern by using the difference between the mask writing data and the mask actual dimension. On the other hand, the dimension verification of a mask pattern by the mask pattern verifying apparatus 1 is a dimension verification of a mask pattern by using the difference between the mask actual dimension and the mask-pattern evaluation value calculated by using the model function.

FIG. 7A and FIG. 7B are diagrams illustrating one example of the dimension verification result of a mask pattern. FIG. 7A and FIG. 7B illustrate the dimension verification result calculated by the conventional dimension verifying method and the dimension verification result calculated by the dimension verifying method (dimension verification using the model function) according to the present embodiment, with respect to a pattern of which minimum circuit dimension is 60 nm.

FIG. 7A illustrates the variation (3σ) of the differences between the mask actual dimension and the mask writing data and the variation (3σ) of the differences between the mask actual dimension and the mask-pattern evaluation value calculated by using the model function, in the monitor portion W and the main circuit portion Xa.

Moreover, FIG. 7B illustrates the average value of the differences between the mask actual dimension and the mask writing data and the average value of the differences between the mask actual dimension and the mask-pattern evaluation value calculated by using the model function, in the monitor portion W and the main circuit portion Xa.

For example, as shown in FIG. 7B, the average value of the differences between the mask writing data and the mask actual dimension is different by 2.6 nm between the monitor portion W and the main circuit portion Xa, which seems problematic. On the other hand, the average value of the differences between the mask-pattern evaluation value calculated by using the model function in the present embodiment and the mask actual dimension is different only by about 0.4 nm between the monitor portion W and the main circuit portion Xa and it is found that there is no problem.

In this manner, the dimension assurance can be performed on an arbitrary pattern formed in various mask ambient environments by performing the dimension verification of a mask pattern by using the model function in the present embodiment.

The dimension assurance (dimension verification) of a mask pattern by the mask pattern verifying apparatus 1 is performed, for example, for each layer in the wafer process. Then, the mask writing data D3 is corrected as needed and a semiconductor device (such as a semiconductor integrated circuit) is manufactured by using a mask on which a mask pattern corresponding to the mask writing data D3 is formed. Specifically, exposure is performed on a wafer to which resist is applied by using a mask that is determined to pass, and thereafter the wafer is developed to form a resist pattern on the wafer. Then, a lower layer side of the resist pattern is etched with the resist pattern as a mask. Consequently, an actual pattern is formed on a wafer. When manufacturing a semiconductor device, the above described dimension verification (mask determination) of a mask pattern, correction of the mask writing data D3, exposure process, development process, etching process, and the like are performed for each layer.

Next, a hardware configuration of the mask pattern verifying apparatus 1 is explained. FIG. 8 is a diagram illustrating the hardware configuration of the mask pattern verifying apparatus. The mask pattern verifying apparatus 1 includes a CPU (Central Processing Unit) 91, a ROM (Read Only Memory) 92, a RAM (Random Access Memory) 93, a display unit 94, and an input unit 95. In the mask pattern verifying apparatus 1, the CPU 91, the ROM 92, the RAM 93, the display unit 94, and the input unit 95 are connected via a bus line.

The CPU 91 executes the dimension verification of a mask pattern by using a mask verifying program 97 that is a computer program. The display unit 94 is a display apparatus such as a liquid crystal monitor, and displays the mask writing data D3, the mask assurance pattern, the mask-pattern evaluation value, the mask actual dimension, the model function, the determination result of a mask, and the like based on an instruction from the CPU 91. The input unit 95 is configured to include a mouse and a keyboard, and inputs instruction information (such as parameter necessary for dimension verification of a mask pattern) that is externally input by a user. The instruction information input to the input unit 95 is sent to the CPU 91.

The mask verifying program 97 is stored in the ROM 92 and is loaded in the RAM 93 via the bus line. FIG. 8 illustrates a state where the mask verifying program 97 is loaded in the RAM 93.

The CPU 91 executes the mask verifying program 97 loaded in the RAM 93. Specifically, in the mask pattern verifying apparatus 1, the CPU 91 reads out the mask verifying program 97 from the ROM 92, loads it in a program storage area in the RAM 93, and executes various processes, in accordance with the input of an instruction by a user from the input unit 95. The CPU 91 temporarily stores various data generated in the various processes in the data storage area formed in the RAM 93.

The mask verifying program 97 executed in the mask pattern verifying apparatus 1 has a module configuration including the verification-pattern extracting unit 15, the mask-pattern-evaluation-value calculating unit 16, the difference calculating unit 17, and the determining unit 18, which are loaded in a main storage device to be generated on the main storage device.

The model function can be a relational expression in which the mask ambient environments same as the mask ambient environments taken into account in a process correction applied when generating the mask writing data D3 (mask assurance pattern) are taken into account. The process correction in this example is a process of correcting, for example, the dimension deviation between the mask writing data D3 and the mask pattern P1 generated attributed to the mask manufacturing, the dimension deviation between the resist pattern data D2 and the resist pattern P2 generated attributed to the lithography, the dimension deviation between the design data D1 and the Si pattern P3 generated attributed to the wafer processing, and the like. In the process correction, as the mask ambient environment, a space pattern width, a line pattern width, a pitch, a pattern coverage, and the like are taken into account. Therefore, the model function is generated in advance taking into account at least one of the mask ambient environments taken into account in the process correction.

Consequently, the difference between the simulation dimension of a mask pattern calculated by the model function and the mask actual dimension becomes a correct value. Therefore, the difference between the actually-measured mask actual dimension and the mask-pattern evaluation value becomes a correct value. Thus, the dimension verification of a mask pattern can be performed accurately.

Moreover, in the present embodiment, explanation is given for the mask pattern assurance in the case where the mask writing data D3 is a line & space; however, the mask pattern verifying apparatus 1 can perform the dimension assurance process of a mask pattern when the mask writing data D3 is a contact pattern.

Furthermore, in the present embodiment, it is determined whether the sum value of the difference between the actually-measured mask actual dimension and the dimension on the mask writing data D3 and Δ that is the variation of this difference is within an allowable range; however, it is possible to determine whether an evaluation value other than the sum value is within the allowable range. In this case, it is verified whether a pattern dimension of a mask pattern formed on a mask passes or fails based on whether the evaluation value (difference evaluation value) obtained by using the difference between the actually-measured mask actual dimension and the dimension on the mask writing data D3 and Δ that is the variation of this difference is within the allowable range.

As above, according to the present embodiment, the dimension assurance of a mask pattern is performed by using the model function generated by taking the mask ambient environments into account, so that the finished dimension assurance of a mask pattern can be accurately performed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of verifying a mask, comprising:
    calculating, using a computer, a computational estimated value of a difference between an actual dimension of a verification target mask pattern to be a verification target extracted from a mask pattern formed on a mask and a simulation dimension of the verification target mask pattern calculated by a mask simulation when forming the verification target mask pattern, as a first difference;

calculating a difference between an actual dimension of the verification target mask pattern that is actually measured and a pattern dimension of the verification target mask pattern on pattern data, as a second difference based on an actual measurement; and verifying whether a pattern dimension of the mask pattern formed on the mask passes or fails based on whether a difference evaluation value obtained by using the first difference and the second difference is within a predetermined allowable range, wherein the calculating the first difference includes calculating the first difference by applying a model function, which is set by using a test pattern formed on a mask for test, to the verification target mask pattern, and the model function is a relational expression set based on each correspondence relationship between an actual dimension of the test pattern and a simulation dimension of the test pattern that is calculated by a mask simulation when forming the test pattern, under a plurality of types of pattern ambient environments.

2. The method according to claim 1, wherein the pattern ambient environment is a pattern ambient environment in which at least one of a line pattern width, a space pattern width, and a pattern coverage is taken into account.

3. The method according to claim 2, wherein the model function is a relational expression in which at least one pattern ambient environment is taken into account among pattern ambient environments that are taken into account in a process correction applied when generating pattern data on the verification target mask pattern.

4. The method according to claim 3, wherein the process correction is a process of correcting at least one of a dimension deviation between mask writing data and a mask pattern generated attributed to mask manufacturing, a dimension deviation between resist pattern data and a resist pattern generated attributed to lithography, and a dimension deviation between design data and an on-substrate pattern generated attributed to substrate processing.

5. The method according to claim 1, wherein the verifying whether the pattern dimension of the mask pattern passes or fails is performed based on whether a variation or an average value of the difference evaluation values calculated for respective verification target mask patterns is within the predetermined range.

6. The method according to claim 1, further comprising arranging the verification target mask pattern in a monitor region, in which a main circuit is not formed, in the mask pattern.

7. A method of manufacturing a semiconductor device, comprising:

calculating a computational estimated value of a difference between an actual dimension of a verification target mask pattern to be a verification target extracted from a mask pattern formed on a mask and a simulation dimension of the verification target mask pattern calculated by a mask simulation when forming the verification target mask pattern, as a first difference;

calculating a difference between an actual dimension of the verification target mask pattern that is actually measured and a pattern dimension of the verification target mask pattern on pattern data, as a second difference based on an actual measurement;

verifying whether a pattern dimension of the mask pattern formed on the mask passes or fails based on whether a difference evaluation value obtained by using the first difference and the second difference is within a predetermined allowable range;

manufacturing a mask by using a mask pattern whose pattern dimension is determined to pass; and generating a semiconductor device on a substrate by using manufactured mask, wherein the calculating the first difference includes calculating the first difference by applying a model function, which is set by using a test pattern formed on a mask for test, to the verification target mask pattern, and the model function is a relational expression set based on each correspondence relationship between an actual dimension of the test pattern and a simulation dimension of the test pattern that is calculated by a mask simulation when forming the test pattern, under a plurality of types of pattern ambient environments.

8. The method according to claim 7, wherein the pattern ambient environment is a pattern ambient environment in which at least one of a line pattern width, a space pattern width, and a pattern coverage is taken into account.

9. The method according to claim 8, wherein the model function is a relational expression in which at least one pattern ambient environment is taken into account among pattern ambient environments that are taken into account in a process correction applied when generating pattern data on the verification target mask pattern.

10. The method according to claim 9, wherein the process correction is a process of correcting at least one of a dimension deviation between mask writing data and a mask pattern generated attributed to mask manufacturing, a dimension deviation between resist pattern data and a resist pattern generated attributed to lithography, and a dimension deviation between design data and an on-substrate pattern generated attributed to substrate processing.

11. The method according to claim 7, wherein the verifying whether the pattern dimension of the mask pattern passes or fails is performed based on whether a variation or an average value of the difference evaluation values calculated for respective verification target mask patterns is within the predetermined range.

12. The method according to claim 7, further comprising arranging the verification target mask pattern in a monitor region, in which a main circuit is not formed, in the mask pattern.

13. The method according to claim 7, further comprising changing, when the pattern dimension is determined to fail, at least one of design data on the verification target mask pattern, resist data pattern, mask writing data, a mask process, a lithography process to the substrate, and an etching process to the substrate.

14. The method according to claim 7, further comprising arranging the verification target mask pattern in both of a main circuit and a monitor region in the mask pattern.

15. A computer program product that is executable in a computer and includes a non-transitory computer readable recording medium including a plurality of instructions for inspecting a mask, the instructions causing the computer to execute:

calculating a computational estimated value of a difference between an actual dimension of a verification target mask pattern to be a verification target extracted from a mask pattern formed on a mask and a simulation dimension of the verification target mask pattern calculated by a mask simulation when forming the verification target mask pattern, as a first difference;

calculating a difference between an actual dimension of the verification target mask pattern that is actually measured and a pattern dimension of the verification target mask pattern on pattern data, as a second difference based on an actual measurement; and verifying whether a pattern dimension of the mask pattern formed on the mask passes or fails based on whether a difference evaluation value obtained by using the first difference and the second difference is within a predetermined allowable range, wherein the calculating the first difference includes calculating the first difference by applying a model function, which is set by using a test pattern formed on a mask for test, to the verification target mask pattern, and the model function is a relational expression set based on each correspondence relationship between an actual dimension of the test pattern and a simulation dimension of the test pattern that is calculated by a mask simulation when forming the test pattern, under a plurality of types of pattern ambient environments.

16. The computer program product according to claim 15, wherein the pattern ambient environment is a pattern ambient environment in which at least one of a line pattern width, a space pattern width, and a pattern coverage is taken into account.

17. The computer program product according to claim 16, wherein the model function is a relational expression in which at least one pattern ambient environment is taken into account among pattern ambient environments that are taken into account in a process correction applied when generating pattern data on the verification target mask pattern.

18. The computer program product according to claim 17, wherein the process correction is a process of correcting at least one of a dimension deviation between mask writing data and a mask pattern generated attributed to mask manufacturing, a dimension deviation between resist pattern data and a resist pattern generated attributed to lithography, and a dimension deviation between design data and an on-substrate pattern generated attributed to substrate processing.

19. The computer program product according to claim 15, wherein the verifying whether the pattern dimension of the mask pattern passes or fails is performed based on whether a variation or an average value of the difference evaluation values calculated for respective verification target mask patterns is within the predetermined range.

20. The computer program product according to claim 15, wherein the verification target mask pattern is a pattern arranged in a monitor region, in which a main circuit is not formed, in the mask pattern.

* * * * *